United States Patent
Yoon et al.

(10) Patent No.: US 7,317,646 B2
(45) Date of Patent: Jan. 8, 2008

(54) MEMORY DEVICE HAVING SHARED OPEN BIT LINE SENSE AMPLIFIER ARCHITECTURE

(75) Inventors: Jae-Man Yoon, Seoul (KR); Choong-Ho Lee, Gyeonggi-do (KR); Dong-Gun Park, Gyeonggi-do (KR); Yeong-Taek Lee, Seoul (KR); Chul Lee, Seoul (KR)

(73) Assignee: Samsung Electronics Co., Ltd., Suwon-si, Gyeongi-do (KR)

( * ) Notice: Subject to any disclaimer, the term of this patent is extended or adjusted under 35 U.S.C. 154(b) by 97 days.

(21) Appl. No.: 11/300,009

(22) Filed: Dec. 13, 2005

(65) Prior Publication Data

US 2006/0215472 A1    Sep. 28, 2006

(30) Foreign Application Priority Data

Mar. 23, 2005   (KR) .................. 10-2005-0024076

(51) Int. Cl.
*G11C 7/00* (2006.01)
(52) U.S. Cl. ..................................... 365/205; 365/207
(58) Field of Classification Search ................ 365/205, 365/207, 208, 194
See application file for complete search history.

(56) References Cited

U.S. PATENT DOCUMENTS

| | | | |
|---|---|---|---|
| 4,888,732 A | 12/1989 | Inoue et al. | |
| 5,016,224 A * | 5/1991 | Tanaka et al. | 365/230.03 |
| 6,914,837 B2 * | 7/2005 | Schroeder et al. | 365/205 |

FOREIGN PATENT DOCUMENTS

| | | |
|---|---|---|
| JP | 07-254650 | 10/1995 |
| JP | 11-053881 | 2/1999 |
| JP | 2002-289815 | 10/2002 |

OTHER PUBLICATIONS

English language abstract of Japanese Publication 07-254650.
English language abstract of Japanese Publication 11-053881.
English language abstract of Japanese Publication 2002-289815.

* cited by examiner

*Primary Examiner*—Vu A. Le
(74) *Attorney, Agent, or Firm*—Marger Johnson & McCollom, P.C.

(57) ABSTRACT

Provided is a memory device with a shared open bit line sense amplifier architecture. The memory device includes memory cell arrays, each memory cell array including bit lines, and a sense amplifier configured to couple to at least two bit lines a memory cell array and configured to couple to at least two bit lines of a different memory cell array.

21 Claims, 8 Drawing Sheets

MEMORY DEVICE HAVING SHARED OPEN BIT LINE SENSE AMPLIFIER ARCHITECTURE

CROSS-REFERENCE TO RELATED PATENT APPLICATIONS

This application claims the priority of Korean Patent Application No. 10-2005-0024076, filed on Mar. 23, 2005, in the Korean Intellectual Property Office, the disclosure of which is incorporated herein in its entirety by reference.

BACKGROUND OF THE INVENTION

1. Field of the Invention

This application relates to semiconductor memory devices, and more particularly, to semiconductor memory devices with a shared open bit line sense amplifier architecture.

2. Description of the Related Art

In a dynamic random access memory (DRAM), design considerations such as the arrangement of memory cells, each including a transistor and a capacitor, and the arrangement of sense amplifiers that sense and amplify data output from each memory cell are significant in determining the area and the performance of the DRAM. In general, a memory cell array including a sense amplifier is arranged according to an open bit line method or a folded bit line method.

FIG. 1 illustrates the open bit line method, in which a memory cell MC is positioned at each intersection of a word line WL and a bit line BL to maximize the density of each memory cell MC and minimize the area of a chip. If the minimum design dimension is F, it is possible to manufacture a memory cell with an area of $4F^2$. However, since each sense amplifier SA must be designed to be arranged inside the pitch of a bit line BL, the design rules for sense amplifiers SA are tight, reducing flexibility in the design of the layout of the sense amplifiers SA. Furthermore, since a pair of bit lines BL connected to the sense amplifier SA are not arranged in the same cell array block, one side of the pair of the bit lines BL may be affected by noise generated in one cell array block, while the other side of the pair is not. Thus, a semiconductor memory device fabricated according to the open bit line method is vulnerable to noise.

FIG. 2 illustrates a relaxed open bit line method in which a memory cell MC is positioned at each intersection of a word line WL and a bit line BL and each sense amplifier SA is arranged inside the pitch of two bit lines BL. It is easier to design the layout of the sense amplifier SA using the relaxed open bit line method than using the open bit line method. However, it is still difficult to design the layout of the sense amplifier SA using the relaxed open bit line method. In addition, a semiconductor memory device manufactured according to the relaxed open bit line method is vulnerable to noise similar to one manufactured according to the open bit line method.

FIG. 3 illustrates a folded bit line method in which a sense amplifier SA is arranged inside the pitch of four bit lines BL, and thus, it is easier to design than a sense amplifier using the open bit line method. In addition, since a pair of bit lines BL connected to the sense amplifier SA are installed in the same cell array block, both sides of the pair of the bit lines BL are affected by noise generated in the cell array. Thus, a semiconductor memory device manufactured using the folded bit line method is more immune to noise. However, a memory cell MC manufactured according to the folded bit line method has an area of $8F^2$. The area of the memory cell MC may be double that of the memory cell MC manufactured according to the open bit line method, increasing the required chip area.

As described above, the area of a memory cell array manufactured according to the open bit line method is reduced, but the memory cell array is vulnerable to noise. In contrast, a memory cell array manufactured according to the folded bit line method is more immune to noise, but the area of a memory cell array is increased.

Since the trend in DRAMs is to increase capacity, the open bit line method has been used in arranging memory cells to reduce the area of each memory cell array. Accordingly, a method of arranging sense amplifiers that reduces noise is required.

SUMMARY OF THE INVENTION

An embodiment includes a memory device including memory cell arrays, each memory cell array including bit lines, and a sense amplifier configured to couple to at least two bit lines a memory cell array and configured to couple to at least two bit lines of a different memory cell array.

A further embodiment includes a method of operating a memory device including selecting a pair of bit lines from at least four bit lines coupled to a sense amplifier, and sensing the two bit lines using the sense amplifier.

BRIEF DESCRIPTION OF THE DRAWINGS

The above and other aspects and advantages of the invention will become more apparent by describing in detail exemplary embodiments thereof with reference to the attached drawings in which.

DETAILED DESCRIPTION OF THE INVENTION

Figure 1:
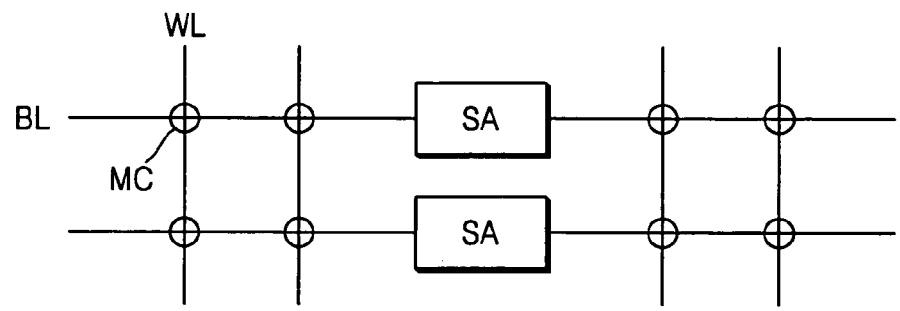
FIG. 1 illustrates a dynamic random access memory (DRAM) fabricated according to the open bit line method.
Figure 2:
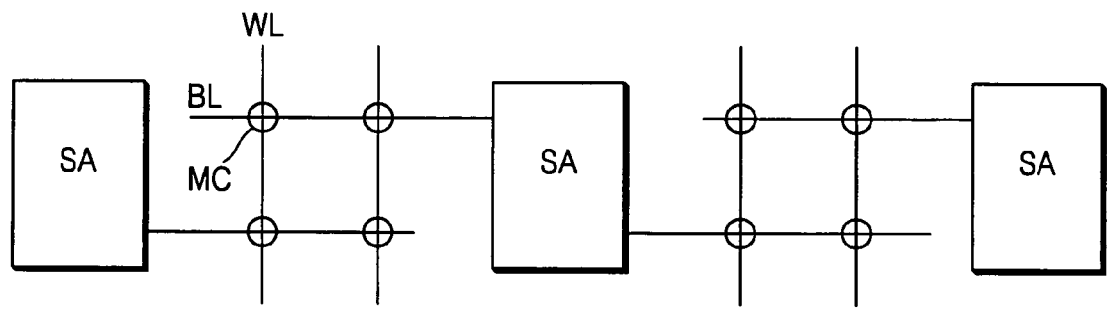
FIG. 2 illustrates a DRAM fabricated according to the relaxed open bit line method.
Figure 3:
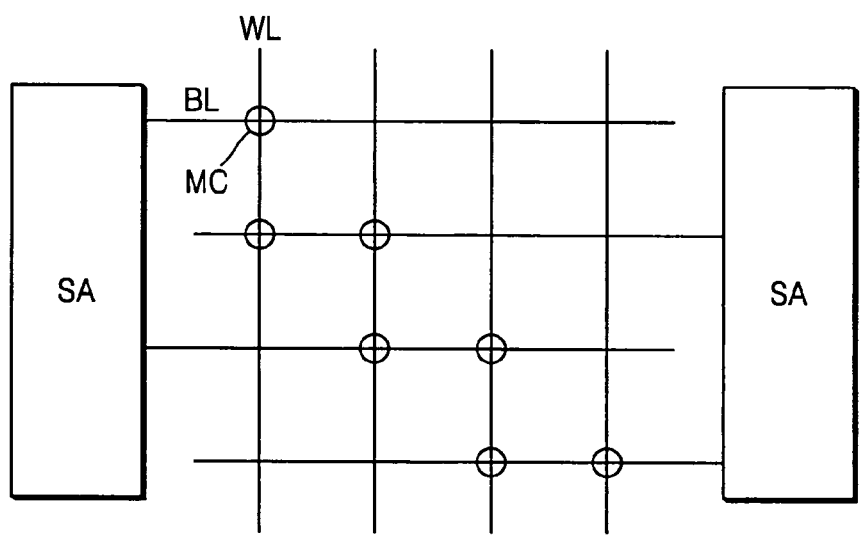
FIG. 3 illustrates a DRAM fabricated according to the folded bit line method.

Hereinafter, exemplary embodiments will be described in detail with reference to the accompanying drawings. Like reference numerals denote like elements in the drawings.

Figure 4:
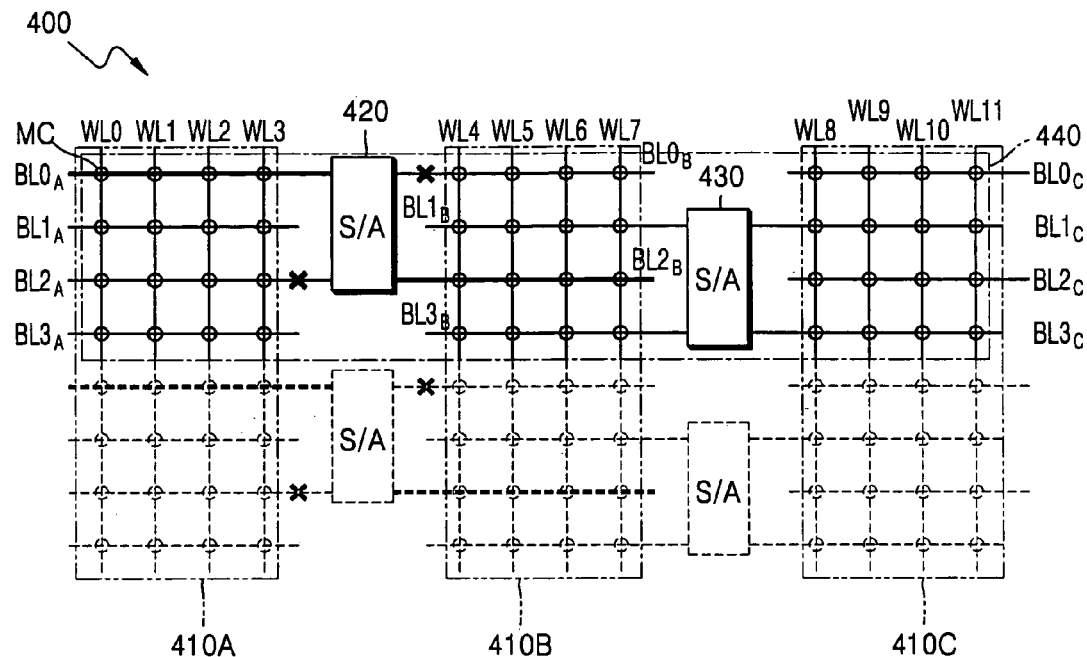
FIG. 4 illustrates a DRAM with a shared open bit line sense amplifier architecture according to an embodiment.

FIG. 4 illustrates a dynamic random access memory (DRAM) 400 with a shared open bit line sense amplifier architecture according to an embodiment. Referring to FIG. 4, the DRAM 400 includes first through third memory cell arrays 410A, 410B, and 410C, each having cells arranged in the form of a matrix. In the first through third memory cell arrays 410A, 410B, and 410C, DRAM cells MC, each including a transistor and a capacitor, are arranged at intersections of word lines WLi and bit lines BLj (i denotes a number from 0 to 11, and j denotes a number from 0 to 3). That is, the first through third memory cell arrays 410A, 410B, and 410C are manufactured according to the open bit line method. If the minimum design dimension is F, the memory cell MC may have an area of $4F^2$ or $6F^2$.

A first sense amplifier 420 is arranged inside the pitch of four bit lines BL0 through BL3 between the first and second memory cell arrays 410A and 410B, and a second sense amplifier 430 is arranged inside the pitch of four bit lines BL0 through BL3 between the second and third memory cell arrays 410B and 410C. Thus, the first sense amplifier 420 is shared by the first and second memory cell arrays 410A and 410B, and the second sense amplifier 430 is shared by the second and third memory cell arrays 410B and 410C.

FIG. 4 illustrates that first through fourth word lines WL0 through WL3 are in the first memory cell array 410A, fifth through eighth word lines WL4 through WL 7 are in the second memory cell array 410B, and ninth through twelfth word lines WL8 through WL11 are in the third cell array 410C. However, the number of word lines in each memory cell array is not limited to four. Referring to FIG. 4, one of the first and second amplifiers 420 and 430 is positioned inside the pitch of the four bit lines BL0 through BL3 in the first through third memory cell arrays 410A, 410B, and 410C. However, one of the first and second amplifiers 420 and 430 may also be positioned inside the pitch of every 4N bit lines (N≧1).

In this embodiment, the four bit lines BL0 through BL3 in the first through third memory cell arrays 410A, 410B, and 410C, and the first and second sense amplifiers 420 and 430 connected to the four bit lines BL0 through BL3 are collectively labeled a unit of layout 440. It is possible to manufacture a large-capacity DRAM 400 by using the unit of layout 440 repeatedly.

The bit lines BL0 through BL3 of the first and second memory cell arrays 410A and 410B adjacent the ends of the first sense amplifier 420 are connected to the first sense amplifier 420. Specifically, a first bit line $BL0_A$ and a third bit line $BL2_A$ of the first memory cell array 410A are connected to the left side of the first sense amplifier 420, and a first bit line $BL0_B$ and a third bit line $BL2_B$ of the second memory cell array 410B are connected to the right side of the first sense amplifier 420.

The bit lines BL0 through BL3 of the second and third memory cell arrays 410B and 410C which are positioned at the ends of the second sense amplifier 430, respectively, are connected to the second sense amplifier 430. Specifically, a second bit line $BL1_B$ and a fourth bit line $BL3_B$ of the second memory cell array 410B are connected to the left side of the second sense amplifier 430, and a second bit line $BL1_C$ and a fourth bit line $BL3_C$ of the third memory cell array 410C are connected to the right side of the second sense amplifier 430.

Figure 5:
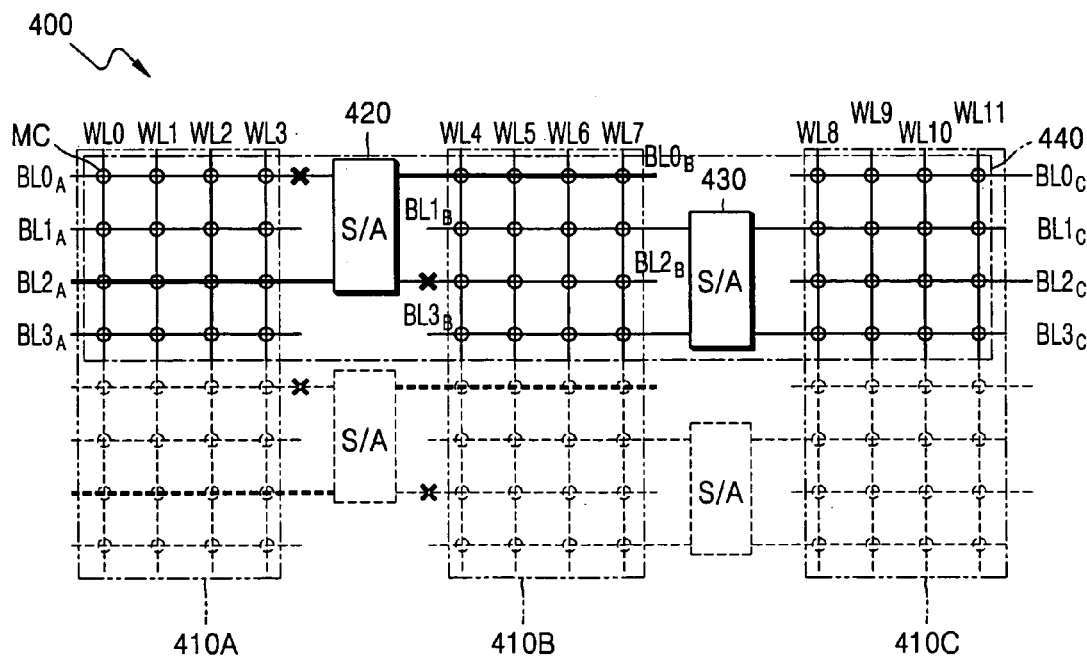
FIGS. 5 through 7 illustrate connection of sense amplifiers to bit lines in the DRAM illustrated in FIG. 4.

The first sense amplifier 420 uses the third bit line $BL2_B$ of the second memory cell array 410B as a reference in sensing the first bit line $BL0_A$ of the first memory cell array 410A, and the first bit line $BL0_B$ of the second memory cell array 410B as a reference in sensing the third bit line $BL2_A$ of the first memory cell array 410A. Similarly, as illustrated in FIG. 5, the first sense amplifier 420 uses the third bit line $BL2_A$ of the first memory cell array 410A as a reference in sensing the first bit line $BL0_B$ of the second memory cell array 410B, and the first bit line $BL0_A$ of the first memory cell array 410A as a reference in sensing the third bit line $BL2_B$ of the second memory cell array 4101B.

In other words, to sense one of the bit lines $BL0_A$ and $BL2_A$ of the first memory cell array 410A as a data line, the first sense amplifier 420 uses one of the bit lines $BL2_B$ and $BL0_B$ of the second memory cell array 410B that is diagonal to the sensed bit line as a reference line. To sense one of the bit lines $BL0_B$ and $BL2_B$ of the second memory cell array 410B as a data line, the first sense amplifier 420 uses one of the bit lines $BL2_A$ and $BL0_A$ of the first memory cell array 410A that is diagonal to the sensed bit line as a reference line.

Figure 6:
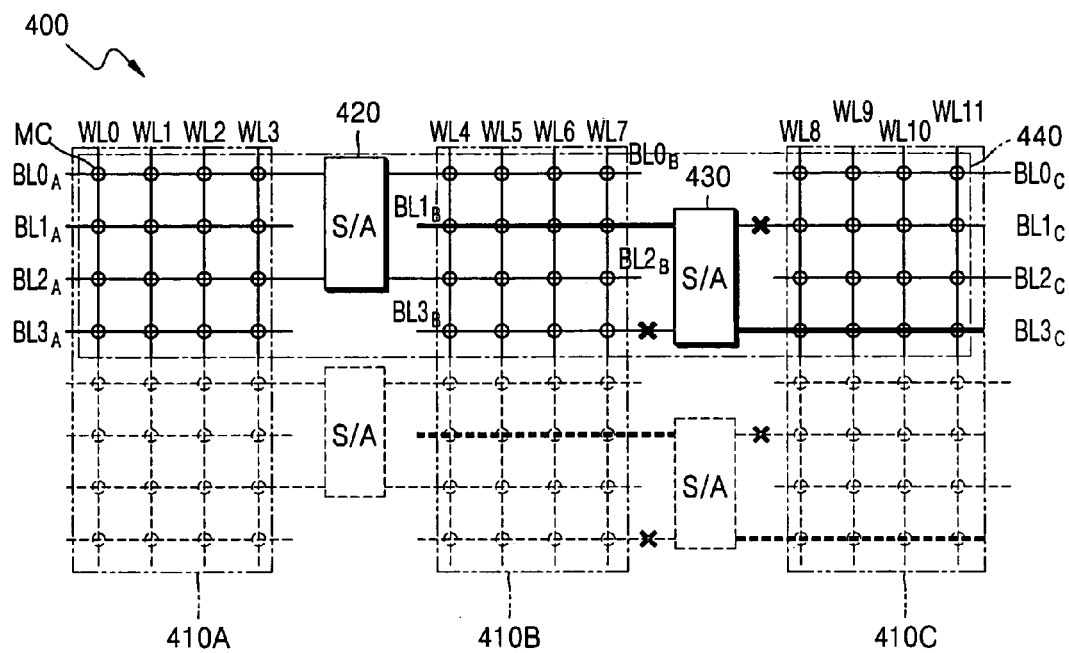
Figure 7:
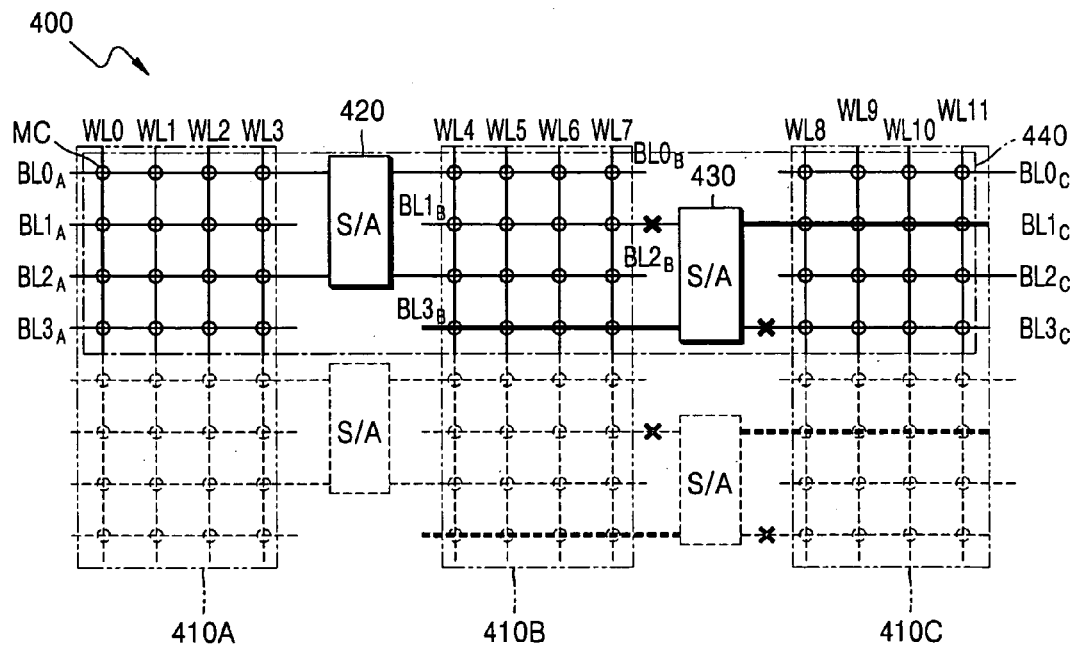

Referring to FIG. 6, the second sense amplifier 430 uses the fourth bit line $BL3_C$ of the third memory cell array 410C as a reference in sensing the second bit line BL1B of the second memory cell array 410B, and the second bit line $BL1_C$ of the third memory cell array 410C as a reference in sensing the fourth bit line $BL3_B$ of the second memory cell array 410B. Similarly, referring to FIG. 7, the second sense amplifier 430 uses the fourth bit line $BL3_B$ of the second memory cell array 410B as a reference in sensing the second bit line $BL1_C$ of the third memory cell array 410C, and the second bit line $BL1_B$ of the second memory cell array 410B as a reference in sensing the fourth bit line $BL3_C$ of the third memory cell array 410C.

That is, to sense one of the bit lines $BL1_B$ and $BL3_B$ of the second memory cell array 410B as a data line, the second sense amplifier 430 uses one of the bit lines $BL3_C$ and $BL1_C$ of the third memory cell array 410C that is diagonal to the sensed bit line as a reference line. Also, to sense one of the bit lines $BL1_C$ and $BL3_C$ of the third memory cell array 410C as a data line, the second sense amplifier 430 uses one of the bit lines $BL3_B$ and $BL1_B$ of the second memory cell array 410B that is diagonal to the sensed bit line as a reference line.

Figure 8:
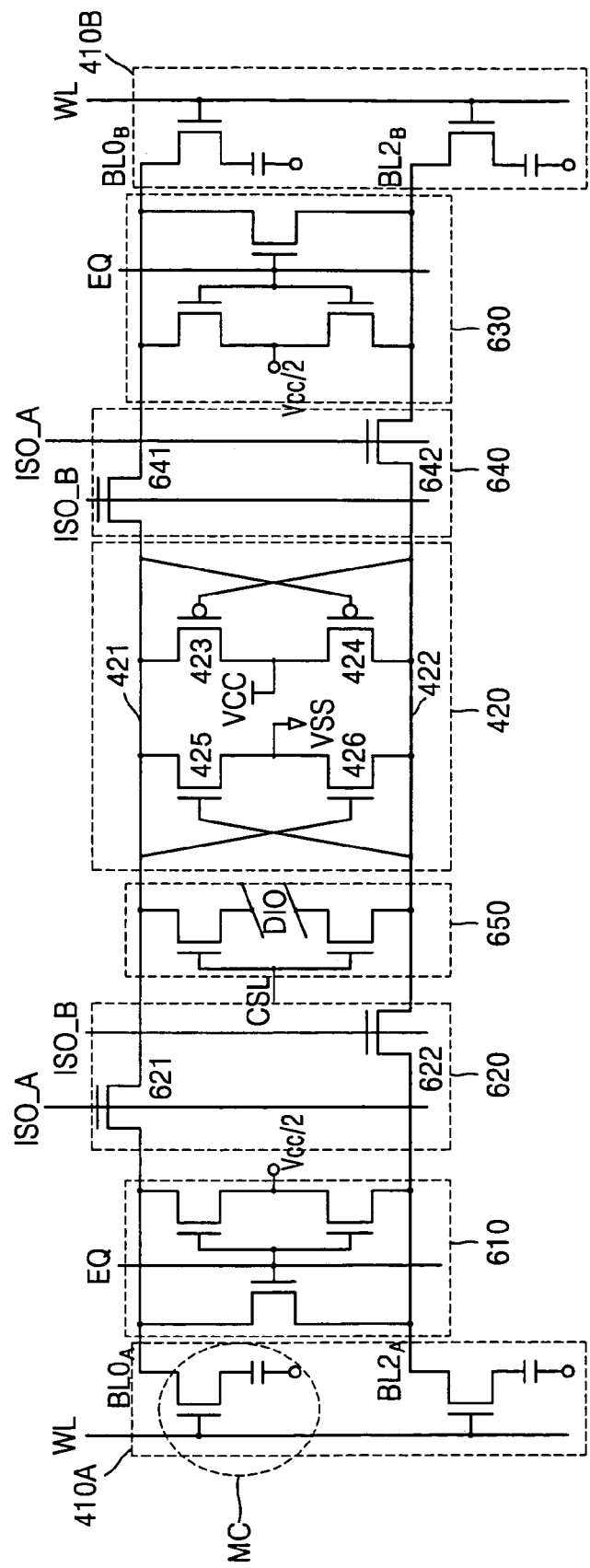
FIG. 8 is a circuit diagram of circuits of bit lines connected to a first sense amplifier illustrated in FIG. 4.

FIG. 8 is a circuit diagram of circuits of bit lines connected to the first sense amplifier 420. Referring to FIG. 8, first and second equalization circuits 610 and 630, first and second isolation units 620 and 640 (also referred to as switching units), a column selection unit 650, and a second sense amplifier 420 are installed between first and third bit lines $BL0_A$ and $BL2_A$ of a first memory cell array 410A, and first through third bit lines $BL0_B$ and $BL2_B$ of the second memory cell array 410B.

The first equalization circuit 610 is connected between the first and third bit lines $BL0_A$ and $BL2_A$ of the first memory cell array 410A. The first equalization circuit 610 equalizes the voltages of the first and third bit lines $BL0_A$ and $BL2_A$ of the first memory cell array 410A with a voltage of Vcc/2 in response to an equalization signal EQ.

The first isolation unit 620 selectively connects the first and third bit lines $BL0_A$ and $BL2_A$ of the first memory cell array 410A to the first sense amplifier 420 in response to a first isolation signal ISO_A and a second isolation signal ISO_B. The first isolation unit 620 includes a first isolation transistor 621 and a second isolation transistor 622. The first isolation transistor 621 transmits a signal of the first bit line $BL0_A$ of the first memory cell array 410A to a first sensing node 421 of the first sense amplifier 420 in response to the first isolation signal ISO_A. The second isolation transistor 622 transmits a signal of the third bit line $BL2_A$ of the first memory cell array 410A to a second sensing node 422 of the first sense amplifier 420 in response to the second isolation signal ISO_B.

The second equalization circuit 630 is connected between the first and third bit lines $BL0_B$ and $BL2_B$ of the second memory cell array 410B, and equalizes the voltages of the first and third bit lines $BL0_B$ and $BL2_B$ of the second memory cell array 410B with a voltage of Vcc/2 in response to the equalization signal EQ.

The second isolation unit 640 includes a third isolation transistor 641 which transmits a signal of the first bit line $BL0_B$ of the second memory cell array 410B to the first sensing node 421 of the first sense amplifier 420 in response to the second isolation signal ISO_B, and a fourth isolation transistor 642 which transmits a signal of the third bit line $BL2_B$ of the second memory cell array 410B to the second sensing node 422 of the first sense amplifier 420 in response to the first isolation signal ISO_A.

The first sense amplifier 420 includes a first PMOS transistor 423 connected between a power supply voltage Vcc and the first sensing node 421, with a gate connected to the second sensing node 422; a second PMOS transistor 424 connected between the power supply voltage Vcc and the second sensing node 422, with a gate connected the first sensing node 421; a first NMOS transistor 425 connected between the first sensing node 421 and a ground voltage Vss, with a gate connected to the second sensing node 422; and a second NMOS transistor 426 connected between the second sensing node 422 and the ground voltage Vss, whose gate is connected to the first sensing node 421.

The column selection unit 650 applies a voltage of the first sensing node 421 sensed by the first sense amplifier 420 and a voltage of the second sensing node 422 to a data line DIO in response to a column selection signal CSL.

In the circuits illustrated in FIG. 8, the first isolation unit 620 transmits a signal of the first bit line $BL0_A$ of the first memory cell array 410A to the first sensing node 421 of the first sense amplifier 420 in response to the first isolation signal ISO_A. The second isolation unit 640 transmits a signal of the third bit line $BL2_B$ of the second memory cell array 410B to the second sensing node 422 of the first sense amplifier 420 also in response to the first isolation signal ISO_A. Accordingly, the first sense amplifier 420 performs a sensing operation using the first bit line $BL0_A$ of the first memory cell array 410A and the third bit line $BL2_B$ of the second memory cell array 410B as a data line and a reference, or a reference line and a data line, respectively.

Alternatively, the first isolation unit 620 transmits a signal of the third bit line $BL2_A$ of the first memory cell array 410A to the second sensing node 422 of the first sense amplifier 420 in response to the second isolation signal ISO_B. The second isolation unit 640 transmits a signal output from the first bit line $BL0_B$ of the second memory cell array 410B to the first sensing node 421 of the first sense amplifier 420 in response to the second isolation signal ISO_B. Thus, the first sense amplifier 420 performs a sensing operation using the third bit line $BL2_A$ of the first memory cell array 410A and the first bit line $BL0_B$ of the second memory cell array 410B as a data line and a reference line, respectively, or a reference line and a data line, respectively.

The operation of the first isolation unit 620 matches the above operation of the first sense amplifier 420 that uses, as a reference line, the bit line $BL2_B$ or $BL0_B$ of the second memory cell array 410B that is diagonal to the bit line $BL0_A$ or $BL2_A$ of the first memory cell array 410A to be sensed as a data line, and uses, as a reference line, the bit line $BL2_A$ or $BL0_A$ of the first memory cell array 410A that is diagonal to the bit line $BL0_B$ or $BL2_B$ of the second memory cell array 410B to be sensed as a data line.

Figure 9:
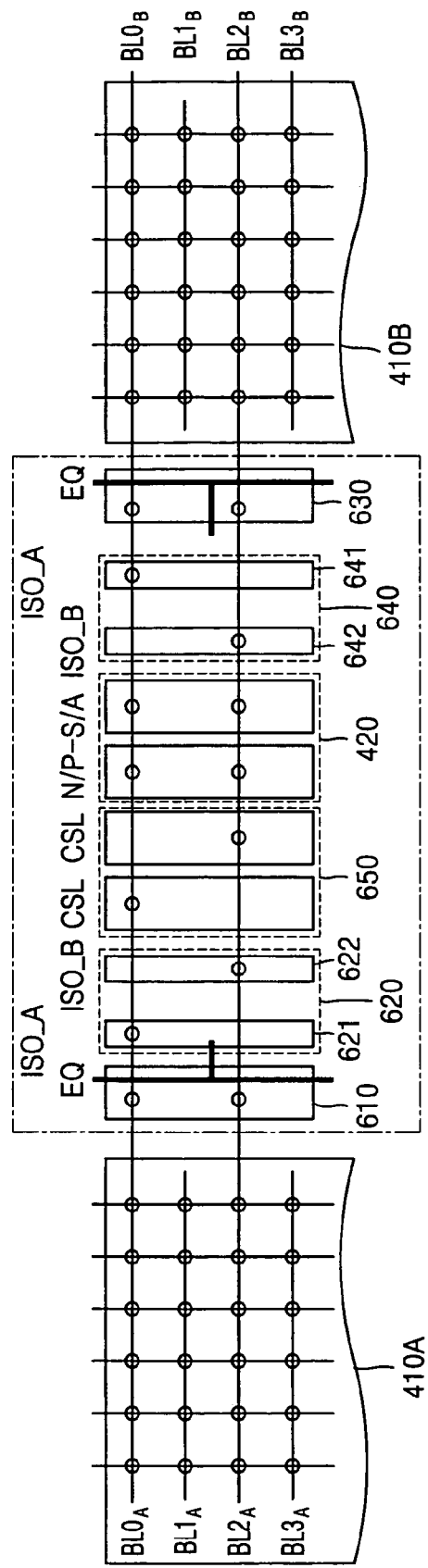
FIG. 9 illustrates a layout of the circuit diagram of FIG. 6.

FIG. 9 illustrates a layout of the circuits of FIG. 8. Referring to FIG. 9, the first equalization circuit 610, the first isolation unit 620, the column selection unit 650, the second sense amplifier 420, the second isolation unit 640, and the second equalization circuit 630 are arranged inside the pitch of the four bit lines BL0 through BL3 between the first memory cell array 410A and the second memory cell array 410B.

Figure 10:
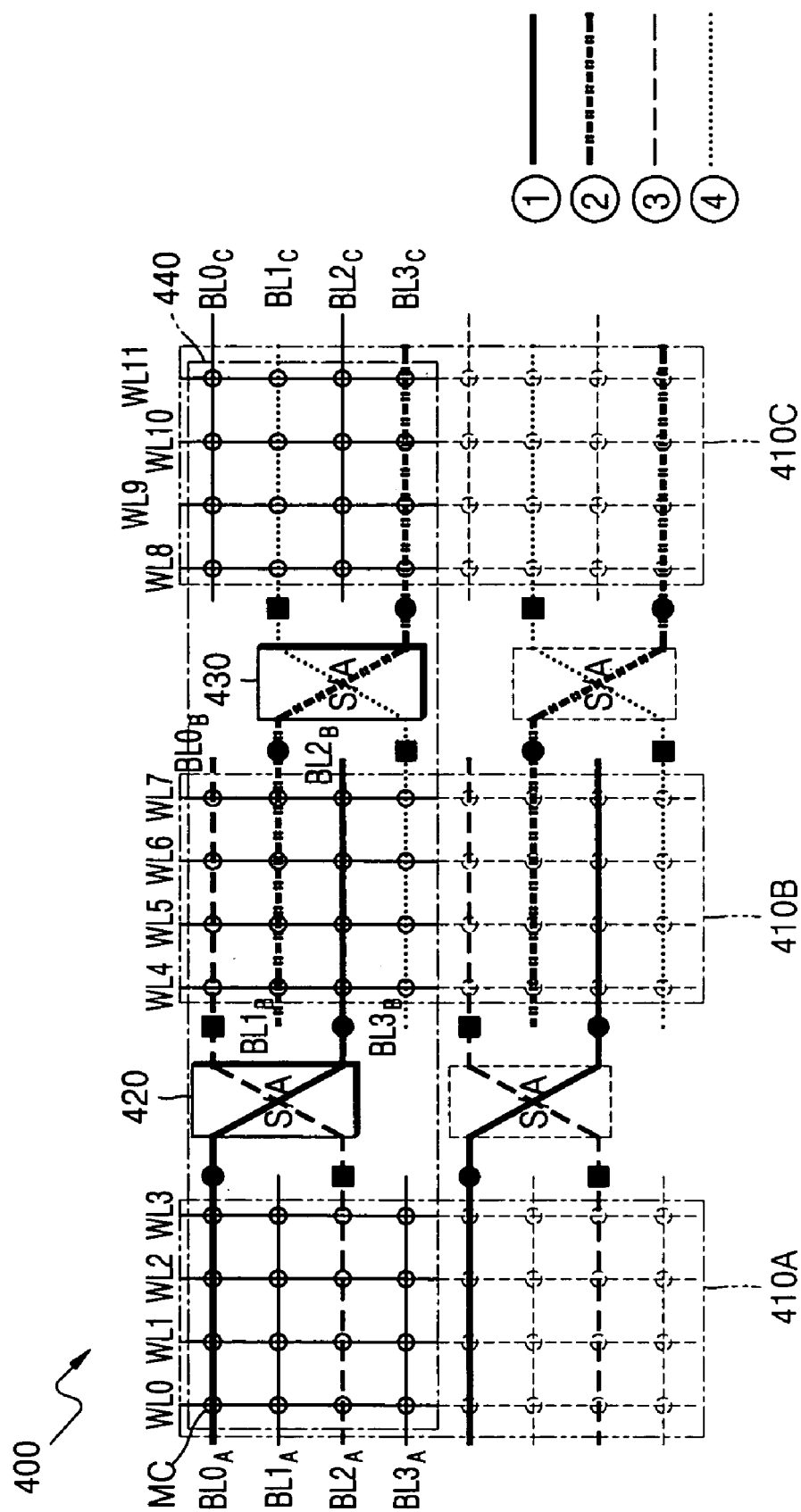
FIG. 10 illustrates the operating sequence of a sense amplifier in the DRAM illustrated in FIG. 4.

FIG. 10 illustrates an operating sequence of each sense amplifier with the shared open bit line architecture sense amplifier, illustrated in FIG. 4. Referring to FIG. 10, first, the first sense amplifier 420 performs a sensing operation using the first bit line $BL0_A$ of the first memory cell array 410A and the third bit line $BL2_B$ of the second memory cell array 410B as a data line and a reference line, respectively, or as a reference line and a data line, respectively (①). Second, the second sense amplifier 430 performs a sensing operation using the second bit line $BL1_B$ of the second memory cell array 410B and the fourth bit line $BL3_C$ of the third memory cell array 410C as a data line and a reference line, respectively, or as a reference line and a data line, respectively (②). Third, the first sense amplifier 420 performs a sensing operation using the third bit line $BL2_A$ of the first memory cell array 410A and the first bit line $BL0_B$ of the second memory cell array 410B as a data line and a reference line, respectively, or as a reference line and a data line, respectively (③). Fourth, the second sense amplifier 430 performs a sensing operation using the fourth bit line $BL3_B$ of the second memory cell array 410B and the second bit line $BL1_C$ of the third memory cell array 410C as a data line and a reference line, respectively, or as a reference line and a data line, respectively (④).

The reason why a sensing operation is performed in the sequence from the first sensing operation ① to the fourth sensing operation ④ will now be described. In the first sensing operation ①, the first sense amplifier 420 senses the first bit line $BL0_A$ of the first memory cell array 410A and the third bit line $BL2_B$ of the second memory cell array 410B to fully swing the voltage of the first bit line $BL0_A$ of the first memory cell array 410A and the voltage of the third bit line $BL2_B$ of the second memory cell array 410B to a power supply voltage Vcc and the ground voltage Vss, respectively. Therefore, the second bit line $BL1_B$ and the fourth bit line $BL3_B$, which are adjacent to the third bit line $BL2_B$ of the second memory cell array 410B, are coupled to the third bit line $BL2_B$ and thus affected by noise.

To reduce problems of the second bit line $BL1_B$ of the second memory cell array 410B caused by noise in the second sensing operation ②, the second sense amplifier 430 senses the second bit line $BL1_B$ of the second memory cell array 410B and the fourth 4 bit line $BL3_C$ of the third memory cell array 410C. As a result of the second sensing operation ②, the voltage of the second bit line $BL1_B$ of the second memory cell array 410B and the voltage of the fourth bit line $BL3_C$ of the third memory cell array 410C fully swing to the power supply voltage Vcc and the ground voltage Vss, respectively. Thus, the first bit line $BL0_B$ adjacent to the second bit line $BL1_B$ of the second memory cell array 410B is coupled to the second bit line $BL1_B$, thus affected by noise.

To reduce problems of the first bit line $BL0_B$ of the second memory cell array 410B caused by noise in the third sensing operation ③, the first bit line $BL0_B$ of the second memory cell array 410B and the third bit line $BL3_A$ of the first memory cell array 410A are sensed. Lastly, in the fourth sensing operation ④, the second sense amplifier 430 senses the fourth bit line $BL3_B$ of the second memory cell array 410B and the second bit line $BL1_C$ of the third memory cell array 410C.

Figure 11:
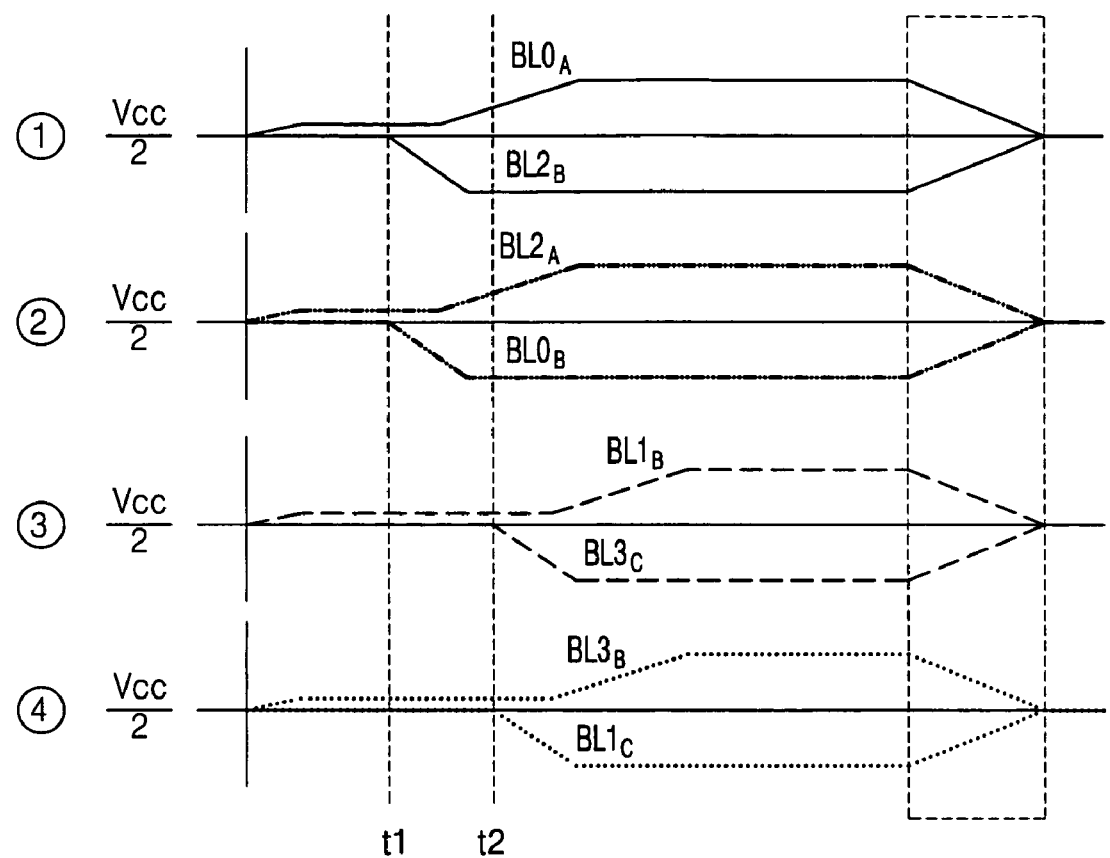
FIG. 11 is a timing diagram of the sensing operation of a sense amplifier according to an embodiment.

As described with reference to FIG. 8, similar to the first and second isolation units 620 and 640 connected to the first sense amplifier 420, third and fourth isolation units (not shown) that operate in response to the first and second isolation signals ISO_A and ISO_B, respectively, can be installed between the second and fourth bit lines $BL1_B$ and $BL3_B$ of the second memory cell array 410B and the second sense amplifier 430 and between the second sense amplifier 430 and the second and fourth bit lines $BL1_C$ and $BL3_C$ of the third memory cell array 410C. In this case, referring to FIG. 11, the first sensing operation ① and the second sensing operation ② are simultaneously performed at a point of time t1, and then, the third sensing operation ③ and the fourth sensing operation ④ are simultaneously performed at a point of time t2.

Figure 12:
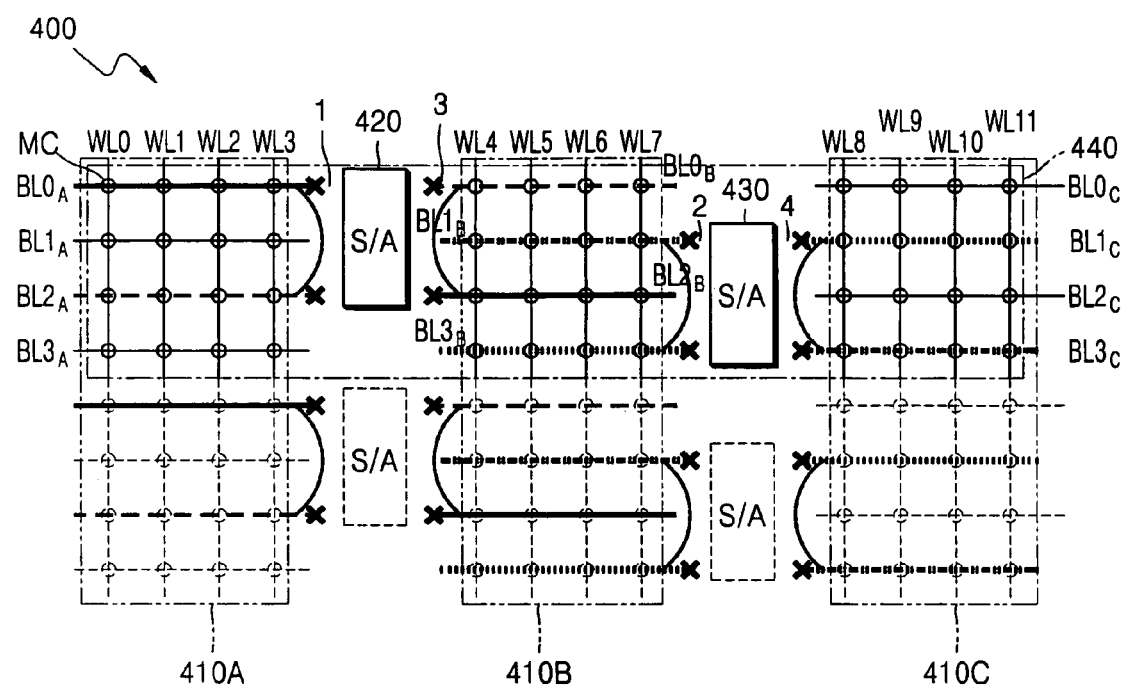
FIG. 12 illustrates equalization of bit lines in the DRAM illustrated in FIG. 4.

FIG. 12 illustrates equalization of bit lines of the DRAM 400 of FIG. 4. Referring to FIGS. 8 and 12, the first and second isolation units 620 and 640 turn off the first and second isolation transistors 621, 622, 641, and 642 when the first and second isolation signals ISO_A and ISO_B are deactivated. Then, the first bit line $BL0_A$ and the third bit line $BL2_A$ of the first memory cell array 410A, and the first bit line $BL0_B$ and the third bit line $BL2_B$ of the second memory cell array 410B are separated from the first sense amplifier 420. Likewise, the second bit line $BL1_B$ and the fourth bit line $BL3_B$ of the second memory cell array 410B, and the second bit line $BL1_C$ and the fourth bit line $BL3_C$ of the third memory cell array 410C are separated from the second sense amplifier 430.

The first equalization unit 610 equalizes the voltages of the first bit line $BL0_A$ and the third bit line $BL2_A$ of the first memory cell array 410A, which are separated from the first sense amplifier 420, with a voltage of Vcc/2 in response to the equalization signal EQ. The second equalization circuit 630 equalizes the voltages of the first bit line $BL0_B$ and the third bit line $BL2_B$ of the second memory cell array 410B, which are separated from the first sense amplifier 420, with the voltage of Vcc/2 in response to the equalization signal EQ. Also, the voltages of the second bit line $BL1_B$ and the fourth bit line $BL3_B$ of the second memory cell array 410B and the second bit line $BL1_C$ and the fourth bit line $BL3_C$ of the third memory cell array 410C, which are separated from the second sense amplifier 430, are equalized with the voltage of Vcc/2 in response to the equalization signal EQ. The voltages of all the bit lines of the DRAM 400 are equalized to the voltage of Vcc/2 in response to the equalization signal EQ.

Accordingly, in a DRAM according to an embodiment, one memory cell is arranged at each intersection of a word line and a bit line, a sense amplifier is arranged inside the pitch of four bit lines in an open bit line architecture with each memory cell having an area of $4F^2$, and a sense amplifier is arranged to be shared by a first memory cell array and a second memory cell array on opposite sides of the sense amplifier. In the sense amplifier, two bit lines are connected to a first memory cell array and two bit lines are connected to a second memory cell array. Also, to sense a bit line of the first memory cell array as a data line, a sense amplifier uses, as a reference line, a bit line of the second memory cell array that is diagonal to the data line.

Although embodiments have been described with reference to three memory cell arrays and two sense amplifiers, one of ordinary skill in the art will understand that embodiments may include any number of memory cell arrays or sense amplifiers.

Although a sense amplifier having isolation units have been described with reference to selectively connecting one bit line from two bit lines to one side of the sense amplifier, one of ordinary skill in the art will understand that an isolation unit may selectively connect one bit line from more than two bit lines to one side of the sense amplifier.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A memory device comprising:
    at least two memory cell arrays, each memory cell array including a plurality of bit lines; and
    at least one sense amplifier, each sense amplifier configured to couple to at least two bit lines of a corresponding first one of the memory cell arrays and configured to couple to at least two bit lines of a corresponding second one of the memory cell arrays, and each sense amplifier configured to sense one of the at least two bit lines of the corresponding first memory cell array using one of the at least two bit lines of the corresponding second memory cell array as a reference line.

2. The memory device of claim 1, wherein each sense amplifier further comprises a plurality of switching units coupled to the sense amplifier configured to couple the bit lines to the sense amplifier.

3. The memory device of claim 2, wherein the switching units of each sense amplifier are configured to decouple all of the bit lines coupled to the sense amplifier from the sense amplifier except for two of the bit lines to be sensed by the sense amplifier.

4. The memory device of claim 1, further comprising at least one equalization circuit configured to equalize at least two bit lines of the bit lines of the at least two memory cell arrays.

5. A memory device comprising:
    first through third memory cell arrays, each memory cell array including at least four bit lines;
    a first sense amplifier configured to couple to at least two bit lines of the first memory cell array and configured to couple to at least two bit lines of the second memory cell array; and
    a second sense amplifier configured to couple to a different at least two bit lines of the second memory cell array and configured to couple to at least two bit lines of the third memory cell array;
    wherein the at least two bit lines of the second memory cell array are interleaved within the second memory cell array with the different at least two bit lines of the second memory cell array.

6. The memory device of claim 5, each of the first and second sense amplifiers further comprising a plurality of switching units coupled to the sense amplifier and configured to couple the bit lines to the sense amplifier.

7. The memory device of claim 6, the switching units of each sense amplifier configured to decouple all of the bit lines coupled to the sense amplifier from the sense amplifier except for two of the bit lines to be sensed by the sense amplifier.

8. The memory device of claim 5, further comprising at least one equalization circuits configured to equalize at least two bit lines of the bit lines of the first through third memory cell arrays.

9. The memory device of claim 8, further comprising a plurality of equalization circuits configured to equalize the bit lines of each of the first through third memory cell arrays substantially simultaneously.

10. The memory device of claim 5, wherein when minimum design dimension is F, the area of one of the at least two memory cells is substantially one of $4F^2$ and $6F^2$.

11. The memory device of claim 5, wherein:
the at least two bit lines of the first memory cell array further comprise a first and a third bit line of the first memory cell array;
the at least two bit lines of the second memory cell array further comprise a first and a third bit line of the second memory cell array;
the different at least two bit lines of the second memory cell array further comprise a second and a fourth bit line of the second memory cell array; and
the at least two bit lines of the third memory cell array further comprise a second and a fourth bit line of the third memory cell array.

12. The memory device of claim 11, further comprising:
a first isolation unit and a second isolation unit configured to couple the first sense amplifier and the first bit line of the first memory cell array and configured to couple the first sense amplifier and the third bit line of the second memory cell array in response to a first isolation signal, and configured to couple the first sense amplifier and the third bit line of the first memory cell array and configured to couple the first sense amplifier and the first bit line of the second memory cell array in response to a second isolation signal; and
a third isolation unit and a fourth isolation unit configured to couple the second sense amplifier and the second bit line of the second memory cell array and configured to couple the second sense amplifier and the fourth bit line of the third memory cell array in response to a third isolation signal, and configured to couple the second sense amplifier and the fourth bit line of the second memory cell array and configured to couple the second sense amplifier and the second bit line of the third memory cell array in response to a fourth isolation signal.

13. A method of operating a memory device, comprising:
selecting a pair of bit lines from at least four bit lines coupled to a sense amplifier, the at least four bit lines including two bit lines of a first memory cell array and two bit lines of a second memory cell array; and
sensing the pair of bit lines using the sense amplifier, the pair of bit lines including a bit line from the two bit lines of the first memory cell array and a bit line from the two bit lines of the second memory cell array.

14. The method of claim 13, wherein the pair of bit lines further comprises a first pair of bit lines and the sense amplifier further comprises a first sense amplifier, the method further comprising:
selecting a second pair of bit lines from at least four bit lines coupled to a second sense amplifier; and
sensing the second pair of bit lines using the second sense amplifier.

15. The method of claim 14, further comprising substantially simultaneously sensing the first pair of bit lines and sensing the second pair of bit lines.

16. The method of claim 14, further comprising substantially sequentially sensing the first pair of bit lines and sensing the second pair of bit lines.

17. The method of claim 14, further comprising:
selecting a third pair of bit lines from the at least four bit lines coupled to the first sense amplifier;
sensing the third pair of bit lines using the first sense amplifier;
selecting a fourth pair of bit lines from the at least four bit lines coupled to the second sense amplifier; and
sensing the fourth pair of bit lines using the second sense amplifier.

18. The method of claim 17, wherein:
a first bit line of a first memory cell array having four bit lines and a third bit line of a second memory cell array having four bit lines form the first pair of bit lines;
a second bit line of the second memory cell array and a fourth bit line of a third memory cell array having four bit lines form the second pair of bit lines;
a third bit line of the first memory cell array and a first bit line of the second memory cell array form the third pair of bit lines; and
a fourth bit line of the second memory cell array and a second bit line of the third memory cell array form the fourth pair of bit lines.

19. The method of claim 17, further comprising substantially sequentially sensing the first pair of bit lines using the first sense amplifier, sensing the second pair of bit lines using the second sense amplifier, sensing the third pair of bit lines using the first sense amplifier, and sensing the fourth pair of bit lines using the second sense amplifier.

20. The method of claim 17, further comprising:
substantially simultaneously sensing the first pair of bit lines using the first sense amplifier and sensing the second pair of bit lines using the second sense amplifier; and
substantially simultaneously sensing the third pair of bit lines using the first sense amplifier and sensing the fourth pair of bit lines using the second sense amplifier.

21. A memory device comprising:
at least two memory cell arrays, each memory cell array including a plurality of bit lines; and
at least one sense amplifier, each sense amplifier configured to couple to at least two bit lines of one of the memory cell arrays and configured to couple to at least two bit lines of a different one of the memory cell arrays;
wherein when minimum design dimension is F, the area of one of the at least two memory cells is substantially one of $4F^2$ and $6F^2$.

* * * * *